United States Patent [19]

Kyrian

[11] Patent Number: 4,593,410
[45] Date of Patent: Jun. 3, 1986

[54] SINGLE-SIDEBAND TRANSMITTER AND METHOD FOR OPERATING THIS TRANSMITTER

[75] Inventor: Bohumil Kyrian, Unterbözberg, Switzerland

[73] Assignee: BBC Brown, Boveri & Co., Ltd., Baden, Switzerland

[21] Appl. No.: 563,506

[22] Filed: Dec. 20, 1983

[30] Foreign Application Priority Data

Dec. 28, 1982 [EP] European Pat. Off. ........ 82201663.0

[51] Int. Cl.⁴ .......................... H04B 1/68; H03C 1/52
[52] U.S. Cl. ..................................... 455/109; 455/47; 332/45
[58] Field of Search .......................... 455/47, 108, 109; 375/61; 332/45

[56] References Cited

U.S. PATENT DOCUMENTS

| | | | |
|---|---|---|---|
| 2,666,133 | 1/1954 | Kahn | 455/109 |
| 2,900,459 | 8/1959 | Olive | 455/109 |
| 2,944,228 | 7/1960 | Olive | 332/45 |
| 3,002,161 | 9/1961 | Feryszka | 332/45 |
| 3,225,316 | 12/1965 | Saraga | 455/109 |
| 3,350,645 | 10/1967 | Kahn | 455/109 |

FOREIGN PATENT DOCUMENTS 908223 4/1946 France .

*Primary Examiner*—Jin F. Ng
*Attorney, Agent, or Firm*—Oblon, Fisher, Spivak, McClelland & Maier

[57] ABSTRACT

A transmitter for single-sideband broadcast transmission which operates in accordance with the principle of combined amplitude and phase modulation generating a single-sideband signal and splitting this signal into an amplitude-modulated component applied to an amplitude-modulated path and a phase-modulated component applied to a phase-modulated path. An amplitude-modulation path is a D.C. voltage-coupled signal path from an envelope-curve detector to a radio-frequency amplifier (2). This results in direct floating-carrier modulation in a radio frequency amplifier in which the amplitude-modulated and phase-modulated components are amplified and recombined.

1 Claim, 2 Drawing Figures

SINGLE-SIDEBAND TRANSMITTER AND METHOD FOR OPERATING THIS TRANSMITTER

BACKGROUND OF THE INVENTION

1. Field of the Invention

The present invention relates to a single-sideband transmitter including a single-sideband generator and an amplifier connected to each other via a phase-modulation (PM) path and an amplitude-modulation (AM) path, and to a method for operating this transmitter.

2. Description of the Prior Art

In the case of a conventional amplitude-modulated medium wave or short wave transmitter, the radiated frequency spectrum of the carrier frequency when amplitude-modulated with a low-frequency signal contains, apart from this carrier frequency, two sidebands of which one is located only a little above and the other only a little below the carrier frequency. Each of these sidebands has the band width of the original low-frequency band and each taken singly completely contains the information of the low-frequency signal. Since the total transmitted power is distributed over both sidebands and the carrier frequency, the power used for transmitting the information is disproportionately high and the efficiency relatively low with reference to the information transmitted. In addition, the transmission of both sidebands also makes the channel width required at least twice as great as with single-sideband operation even though no additional information is transmitted in the additional band.

To reduce the power required in the transmitter and to reduce the channel width, single-sideband transmitters have long been used, especially for small mobile radio stations. However, the saving in energy obtained by single-sideband operation gains special significance in high-power broadcast transmitters in which the use of energy is a significant factor in the calculation of operating costs. Early attempts therefore were made to operate broadcast transmitters with single-sideband modulation. In such attempts, already existing amplitude-modulation transmitters were frequently modified for single-sideband transmission in the following manner: the amplitude-modulation modulator, in most cases a class B push-pull amplifier which has in its output a modulation transformer, was cut off. Single-sideband modulation was carried out at a low power level at the radio-frequency source of the transmitter, that is, for example, at the carrier-frequency oscillator or synthesizer. The transmitter then worked as a linear power amplifier for the single-sideband signal, the amplifier stages being changed over to class B mode from the class C mode customary for amplitude modulation.

It is true that this type of modification considerably reduced the channel width of the transmitter. However, the achievable peak of the envelope power was only about 50% of the rated power of the transmitter. If in addition a residual carrier was also radiated, the single-sideband power was possibly even less than that achievable in the amplitude-modulation mode of operation. For the rest, the overall efficiency of the transmitter deteriorated considerably as a result of the transition to class B operation in the output stage so that the usefulness of such a change-over was at best marginal.

Another possibility of single-sideband operation consists in generating the single-sideband at a high power level in the final stage of the transmitter by means of a suitable combination of amplitude and frequency modulation. Such a method is described, for example, in the article by O. Villard, Electronics, Vol. 21, November 1948, pp 86 et seq. The single-sideband system illustrated there consists of a combined amplitude and phase modulation in which a constant phase shift of 90° is maintained between the two low-frequency modulation signals which are otherwise identical. As a result of this phase shift, the two upper or lower sidebands are largely suppressed in the resulting frequency spectrum. In practice, however, it has been found to be extremely difficult to construct suitable phase shifters which guarantee that the required 90° phase shift occurs over the wide frequency range of a broadcast transmitter.

Another type of single-sideband transmitter is known from the article by L. Kahn, Proc. I.R.E., July 1952, pp.803 et seq. There too the starting point is a combined amplitude and phase modulation which leads to an amplified single-sideband signal in the final stage of the transmitter. But it differs from the aforementioned single-sideband method in that here, instead of using two similar low-frequency modulation signals which are phase shifted by 90°, the single-sideband signal is generated in a single-sideband generator and consists of one amplitude-modulated component and one phase-modulated component. The single sideband signal is split into these components at low power. The phase-modulated component is separately amplified and used as a phase-modulated carrier. The amplitude-modulated component is also separately amplified in a conventional push-pull class B modulator and used in known manner to modulate the phase-modulated carrier as an envelope curve. The combination of the two components again produces the original single-sideband signal in amplified form.

In the single-sideband transmitter described, problems occur in the general case where the low-frequency signal is an audio signal with a mean amplitude value which changes with time. In this case, the amplitude-modulated component of the single-sideband signal contains a direct-voltage component which changes with time and which cannot be transferred via the modulation transformer of the amplitude modulator. For this reason, an additional circuit for floating-carrier modulation must be provided which contains, for example, a series of d.c.-voltage amplifiers and modulates via a valve grid the final stage of the transmitter as a function of the d.c.-voltage component mentioned. The carrier amplitude can be modulated in this manner only from its nominal value to zero. The upper half wave, on the other hand, cannot be implemented in this way. Because of the considerable additional expenditure which is involved in achieving full floating-carrier modulation, this type of transmitter is essentially used for telegraphy with frequency-shift keying because no need exists there for floating-carrier modulation, because of the constant signal amplitudes, and the requirements on the linearity of the transmitter are relatively low.

SUMMARY OF THE INVENTION

Accordingly, the objects of the invention are to provide a novel single-sideband transmitter which, on the one hand, as a result of the principle of combined amplitude and phase modulation, has a correspondingly high efficiency and in particular a high peak envelope power and which, on the other hand, is suitable for broadcast transmission without complicated or expensive circuitry.

These and other objects are achieved by providing a novel single-sideband transmitter of the type mentioned initially, wherein additionally the amplitude modulation path of the amplitude modulation component of the single-sideband signal is d.c. voltage coupled from the output of the envelope-curve detector to the r.f. amplifier.

The d.c.-voltage coupling according to the invention in the amplitude-modulation (AM) path guarantees that the whole amplitude-modulated component, including its d.c.-voltage component, can be transferred via the AM path to the final stage of the transmitter so that no additional modulation path is needed for floating-carrier modulation.

It is of particular advantage for the quality of the broadcast transmission if the AM path has, in accordance with a preferred embodiment of the invention, a bandwidth from 0 Hz to at least 5 kHz and has a linear frequency response within this bandwidth. Then the harmonics contained in the amplitude-modulated component are also transmitted such that in the final stage of the transmitter the largely undistorted single-sideband signal is again produced.

In a preferred illustrative embodiment, the amplitude modulator is a switched amplifier and in the AM path a phase-correction circuit is arranged between the envelope-curve detector and the amplitude modulator. This phase-correction circuit equalizes phase shifts between the fundamental and the harmonics in the AM path, which are produced in the required low-pass filter at the output of the switched amplifier. Using a switched amplifier results in a considerable improvement in the efficiency of the transmitter as compared to the known transmitter circuits, while simultaneously providing d.c.-voltage coupling.

Furthermore, it is advantageous to use as an amplitude modulator a special type of switched amplifier, the stair step modulator or pulse-step modulator (PSM), because this switched amplifier simplifies the transmitter construction and in particular the anode-voltage supply for the output stage of the transmitter and, on the other hand, has already been successfully used in transmitter applications.

Additional advantages are produced if the single-sideband generator is constructed of two similar single-sideband modulators of which in each case one single-sideband modulator is associated with one modulation path and if, in front of the single-sideband modulator of the FM path, in this path a signal-correction circuit is arranged which simulates the transmission characteristic of the amplitude modulator. In this manner, the frequency and phase responses in the two paths are matched so that during the subsequent combining of the amplitude- and the phase-modulated components in the final stage of the transmitter the original single-sideband signal is again produced with high accuracy. Compared with the known circuits, this leads to a considerably improved transmission quality.

In a method for operating a single-sideband transmitter in accordance with the invention, a single-sideband generator generates a single-sideband signal which is split by means of an envelope-curve detector and a limiter amplifier into an amplitude-modulated component and a phase-modulated component. These components are amplified and recombined in the radio-frequency amplifier into an amplified single-sideband signal, wherein a d.c.-voltage component of the amplitude-modulated component is used directly for floating-carrier modulation in the radio-frequency amplifier via the d.c.-voltage coupled AM path.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
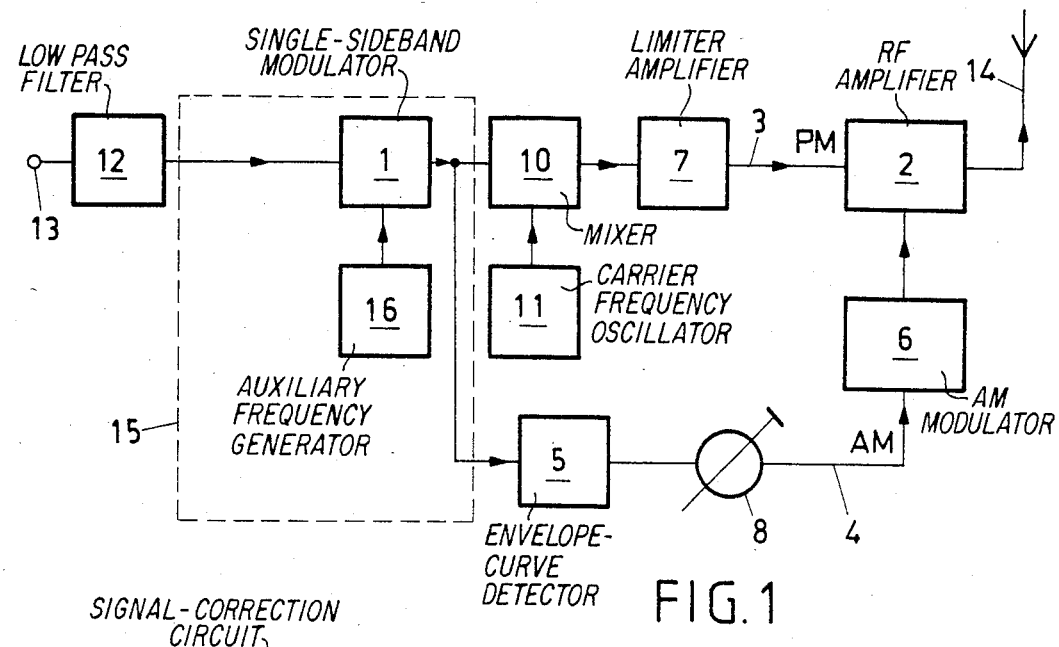
FIG. 1 is a block diagram of a single-sideband transmitter in accordance with a preferred illustrative embodiment of the invention.

Referring now to the drawings, wherein like reference numerals designated identical or corresponding parts throughout the several views, and more particularly to FIG. 1 thereof, the block diagram of a single-sideband transmitter is shown, which results from a preferred illustrative embodiment in accordance with the invention. The low-frequency or audio signal which is to be transmitted by the transmitter reaches, via a low-frequency input 13 in a known manner, a low-pass filter 12 which limits the band width of the low-frequency signal to a predetermined value. The low-pass filter 12 is followed in the circuit by a single-sideband generator 15 which contains at least one single-sideband modulator 1. In the single-sideband modulator 1, the bandwidth-limited low-frequency signal is processed, in conjunction with an auxiliary frequency from an auxiliary-frequency generator 16, to form a single-sideband signal. This happens, for example, in accordance with the known method of amplitude modulation with subsequent suppression of one sideband and of the auxiliary frequency.

At the output of the single-sideband modulator 1, the signal path divides and leads, on the one hand, via an PM path 3 and, on the other hand, via an AM path 4 to a radio-frequency amplifier 2 which delivers a high power single-sideband signal to an antenna 14. The PM path 3, via which the phase-modulated component of the single-sideband signal reaches the radio-frequency amplifier 2, essentially contains the combination of a mixer stage 10 and a carrier-frequency oscillator 11 and, following it in the circuit, a limiter amplifier 7. In the mixer stage 10, the single-sideband signal is customarily converted to the desired carrier frequency of the transmitter. The resulting signal appears at the input of the limiter amplifier 7 which largely suppresses the amplitude-modulated component and passes the phase-modulated component, already amplified, to the subsequent radio-frequency amplifier 2 where it is applied, as in AM modulation, as carrier frequency to a control grid of the transmitter valve.

In the preferred illustrative embodiment of FIG. 1, the AM path 4 includes an envelope-curve detector 5, a phase-correction circuit 8 and an amplitude modulator 6 constructed of a switched amplifier, to the radio-frequency amplifier 2. The switched amplifier is advantageously a stair step modulator (PSM) such as is known from the printed document BBC Mitteilungen, 1982, pages 212 et seq. Such a switched amplifier, which simulates an analog input signal by means of switching in and out, in a controlled manner, discrete switched stages in the form of a train of steps, guarantees in a particularly favorable manner, by reason of its operating principle, that the envelope-curve detector 5 is coupled to the radio-frequency amplifier 2 via the d.c.-voltage coupling according to the invention. In this manner, the d.c.-voltage components contained in the envelope curve and in the amplitude-modulated component of the single-sideband signal at the output of the envelope-curve detector 5, respectively, are transferred to the radio-frequency amplifier 2, and there effect the necessary floating-carrier modulation of the transmitter.

Because of the special character of the single-sideband signal, the envelope curve in the case of a sinusoidal low-frequency input signal is no longer sinusoidal but, depending on the degree of modulation, contains more or less distinctly marked harmonics which must be taken into consideration in the transmission characteristic selected for the AM path 4. Since the switched amplifier is of necessity followed in the circuit internally at the output by a low-pass filter, not drawn in FIG. 1, for suppressing the switching frequency, which filter causes phase shifts between a fundamental and its associated harmonics, it is advantageous to provide phase pre-correction for the frequencies in the phase-correction circuit 8 in such a manner that the distortions from the two circuit sections just cancel when added. Altogether, this results for the AM path 4 in an unbroken frequency response of the correct phase, which ranges from 0 Hz up to a cut-off frequency of $f_{max}$.

Figure 2:
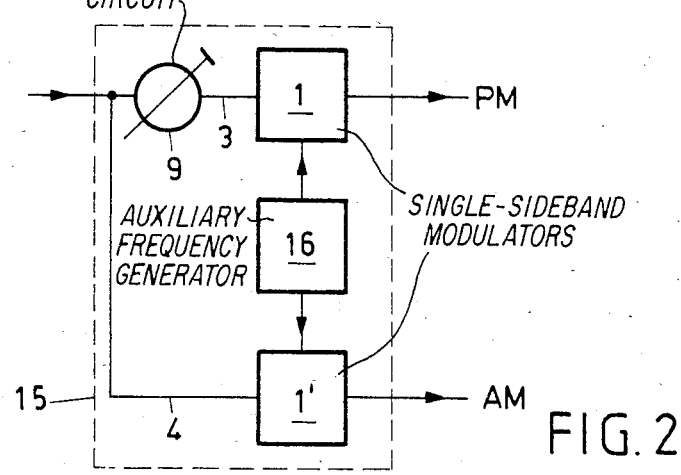
FIG. 2 is a block diagram of a single-sideband generator having two similar single-sideband modulators and a signal-correction circuit.

In accordance with another embodiment of the invention, in the single-sideband transmitter a single-sideband generator 15 is used which contains two similar single-sideband modulators 1 and 1' as shown in FIG. 2. Both single sideband modulators 1 and 1' receive the same auxiliary frequency signal from auxiliary frequency generator 16. The one modulator 1 is associated with the PM path 3 and the other modulator 1' with the AM path 4. In this arrangement, the signal path already branches after the low-pass filter 12. One branch leads directly to the single-sideband modulator 1' of the AM path whereas the other branch reaches the single-sideband modulator 1 via a signal-correction circuit 9.

The signal-correction circuit 9 achieves different objects: due to the different circuit components arranged in the AM path 4 and the PM path 3, their transmission characteristics differ correspondingly. In particular in the case of the AM path 4, this characteristic is also significantly determined by the transmission characteristic of the amplitude modulator 6, especially in the form of a switched amplifier. In order to be able to recover the single-sideband signal in the radio-frequency amplifier 2 from the phase-modulated and the amplitude-modulated components with as little distortion as possible, it is advantageous to match the transmission characteristics of both paths to a large extent. For this reason, the signal-correction circuit 9 simulates the transmission characteristic of the amplitude-modulator 6. On the one hand, this leads to a correction of the frequency response and, on the other hand, delay times arising during the digital analog conversion in a switched amplifier can be equalized. It is found to be particularly advantageous to arrange the signal correction circuit 9 in the PM path 3 in front of the associated single-sideband modulator 1 because there the correction can take place in the low-frequency region whereas the single-sideband signal at the output of the modulator 1 has already been shifted towards much higher frequencies and a correction at this point is, relatively, more complicated and more expensive to implement.

In addition, it is of advantage for the quality of the broadcast transmissions to design the transmission characteristics of the AM path 4 in such a manner that the path is largely linear within a bandwidth from 0 Hz to at least 5 kHz because the distortions can thus be reduced to a harmless value.

Altogether, the invention results in a single-sideband transmitter for broadcast transmissions which, whilst having a good transmission quality and a reduced bandwidth, has an efficiency which is high overall and has a correspondingly high power output and can be easily implemented. In particular, such a single-sideband transmitter can be realized by simple modification of already existing AM transmitters so that either the operating costs of existing systems can be reduced whilst retaining the same range, or the range can be considerably increased whilst continuing to use the same power.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A single-sideband transmitter having a phase-modulation path and an amplitude modulation path, comprising:
   a single-sideband generator;
   a radio-frequency amplifier connected to said single-sideband generator via said amplitude-modulation path and said phase-modulation path;
   a limiter amplifier provided in said phase-modulation path;
   said amplitude-modulation path comprising an envelope-curve detector having an input coupled to said single-sideband generator and an output, a phase-correction circuit coupled to said output for correcting the phase of said detector output, and an amplitude-modulator connected in series with said phase-correction circuit, whereby the amplitude-modulation path is dc voltage coupled from the output of the envelope-curve detector to the radio-frequency amplifier;
   said amplitude modulator comprising a switch amplifier having plural controllable switching stages, said switching stages making possible a progressive increase and decrease of an output voltage of the switch amplifier; and
   wherein the single-sideband generator comprises,
   a pair of single-sideband modulators each coupled to a respective modulation path, and
   a single correction circuit disposed in front of the single-sideband modulator of the phase modulation path, said single-correction circuit simulating the transmission characteristic of the amplitude modulator.

* * * * *